(12) United States Patent
Samuels

(10) Patent No.: US 6,483,937 B1
(45) Date of Patent: Nov. 19, 2002

(54) PROCESS FOR INSPECTING AN OBJECT

(75) Inventor: Donald J. Samuels, Silverthorne, CO (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/335,093

(22) Filed: Jun. 17, 1999

(51) Int. Cl.[7] .................................................. G06K 9/00
(52) U.S. Cl. ........................... 382/144; 382/145; 348/87
(58) Field of Search ............................. 382/100, 141, 382/144, 145, 146, 147, 149, 150, 151; 348/86, 87, 125, 126; 430/30, 22; 356/394, 237.1–237.5, 239.7, 239.8; 716/5, 12, 15, 16; 438/142, 294; 250/559.39–559.42

(56) References Cited

U.S. PATENT DOCUMENTS

| | | | | |
|---|---|---|---|---|
| 4,579,455 A | * | 4/1986 | Levy et al. ................... | 356/394 |
| 4,623,256 A | * | 11/1986 | Ikenaga et al. .............. | 356/394 |
| 5,173,719 A | * | 12/1992 | Taniguchi et al. ........... | 356/394 |
| 5,287,290 A | * | 2/1994 | Tabara et al. ................ | 716/5 |
| 5,691,812 A | | 11/1997 | Bates et al. | |
| 5,767,974 A | * | 6/1998 | Higashiguchi et al. ...... | 356/394 |
| 5,781,657 A | | 7/1998 | Masuda | |
| 5,795,688 A | * | 8/1998 | Burdorf et al. ............... | 430/30 |
| 5,965,306 A | * | 10/1999 | Mansfield .................... | 430/22 |

* cited by examiner

*Primary Examiner*—Joseph Mancuso
*Assistant Examiner*—Vikkram Bali
(74) *Attorney, Agent, or Firm*—H. Daniel Schnurmann; Schmeiser Olsen & Watts

(57) ABSTRACT

A computer operated process (30) for inspecting patterns (32, 34) on an object (31) includes establishing different mismatch margins for different patterns (32, 34). A strict margin is associated with the pattern (32) in a critical area (12), and a relaxed margin is associated with the pattern (34) in a non-critical area (14). The inspection process (30) rejects the object (31) as being defective if a mismatch between a pattern (32, 34) and its respective master pattern (42, 44) exceeds a corresponding mismatch margin. Therefore, the inspection process (30) maintains a high standard for the pattern (32) in the critical area (12) and eases the standard for the pattern (34) in the non-critical area (14).

20 Claims, 4 Drawing Sheets

PROCESS FOR INSPECTING AN OBJECT

BACKGROUND OF THE INVENTION

1. Technical Field

The present invention relates, in general, to inspection processes and, more particularly, to mask defect inspection processes.

2. Background Art

Semiconductor devices and integrated circuits are fabricated on semiconductor chips. A fabricated semiconductor chip has both active and inactive areas. The active areas are the areas in which actual semiconductor device or circuit features are formed, whereas the inactive areas do not have an actual device or circuit formed thereon. An inactive area can be located between adjacent active areas and/or on the periphery of the chip.

Photolithography is widely used in semiconductor device fabrication. In a photolithography process, a pattern is formed on a photoresist layer over a semiconductor chip using a mask. Through the pattern in the photoresist layer, an etching process forms structures, e.g., openings in dielectric layers, trenches in the semiconductor substrate, etc., on the chip. The etching process is often followed by other fabrication steps such as, for example, dopant implantation, oxide growth, chemical vapor deposition, metal deposition, polishing, and the likes. The quality of the mask can have significant effects on the reliability, performance, and yield of the semiconductor devices and/or circuits fabricated on the chip. Therefore, the mask is routinely inspected for defects. A defective mask is either repaired to restore its quality or scrapped and replaced.

During a mask inspection process, the mask is compared with a design layout that generated the mask. If a mismatch between a pattern on the mask and the design layout data exceeds a predetermined criterion, the mask is considered defective. The inspection process does not distinguish between patterns in active areas and patterns in inactive areas. However, the semiconductor device fabrication process is significantly more sensitive or intolerable to mismatches in the active areas than to mismatches in the inactive areas. In addition, the fabrication process can have different sensitivities to mismatches in different portions of the active areas. In order to ensure high quality, performance, reliability, and yield, the mismatch criterion is conventionally established according to the most sensitive or least tolerable pattern features in the active areas. Consequently, a mismatch in the inactive areas that has insignificant effect on the device performance can render the mask defective. This will result in unnecessary scraps and/or repairs of the mask, thereby increasing the cost and cycle time of the semiconductor device fabrication process.

Accordingly, it would be advantageous to have a mask inspection process that improves the time efficiency and cost efficiency of semiconductor device fabrication processes. It is desirable for the process to be simple and easy to implement. It would of further advantage for the process to be compatible with existing mask inspection apparatuses.

SUMMARY OF THE INVENTION

Generally, the present invention provides a process for inspecting an object. By way of example, the object is a mask or a reticle used in a photolithography process, and the process inspects the mask to detect defects in the patterns on the mask. In accordance with the present invention, the inspection process establishes at least two defect criteria or margins. A first criterion or margin is associated with patterns in a more sensitive or critical area on the mask, and a second criterion or margin is associated with patterns in a less sensitive or critical area on the mask. The first criterion is stricter than the second criterion. In other words, the first margin is smaller than the second margin. The inspection process rejects the mask as defective if a mismatch between a pattern in the more critical area and the predetermined design data exceeds the strict first criterion. The inspection process also rejects the mask as defective only if a mismatch between a pattern in the less critical area and the predetermined design data exceeds the relaxed second criterion. Therefore, the inspection process is able to maintain a high standard on the mask in the more critical areas and relax the standard in the less critical areas. Consequently, the quality of the mask is ensured without incurring unnecessary repair and scrap costs of the mask and the photolithography process.

BRIEF DESCRIPTION OF THE DRAWINGS

It should be noted that the figures are not necessarily drawn to scale and that elements having similar functions are labeled using the same reference numerals in the figures.

DETAILED DESCRIPTION OF THE PREFERRED EMBODIMENTS

Preferred embodiments of the present invention are described herein below with processes for inspecting masks used in semiconductor device fabrication as examples. It should be noted that the present invention is not limited to being applicable in semiconductor device fabrication processes. Those skilled in the art can readily apply the principle of the present invention in other areas such as, for example, printed circuit board manufacturing, mass reproduction of artistic patterns, mass design pattern printing, etc.

Figure 1:
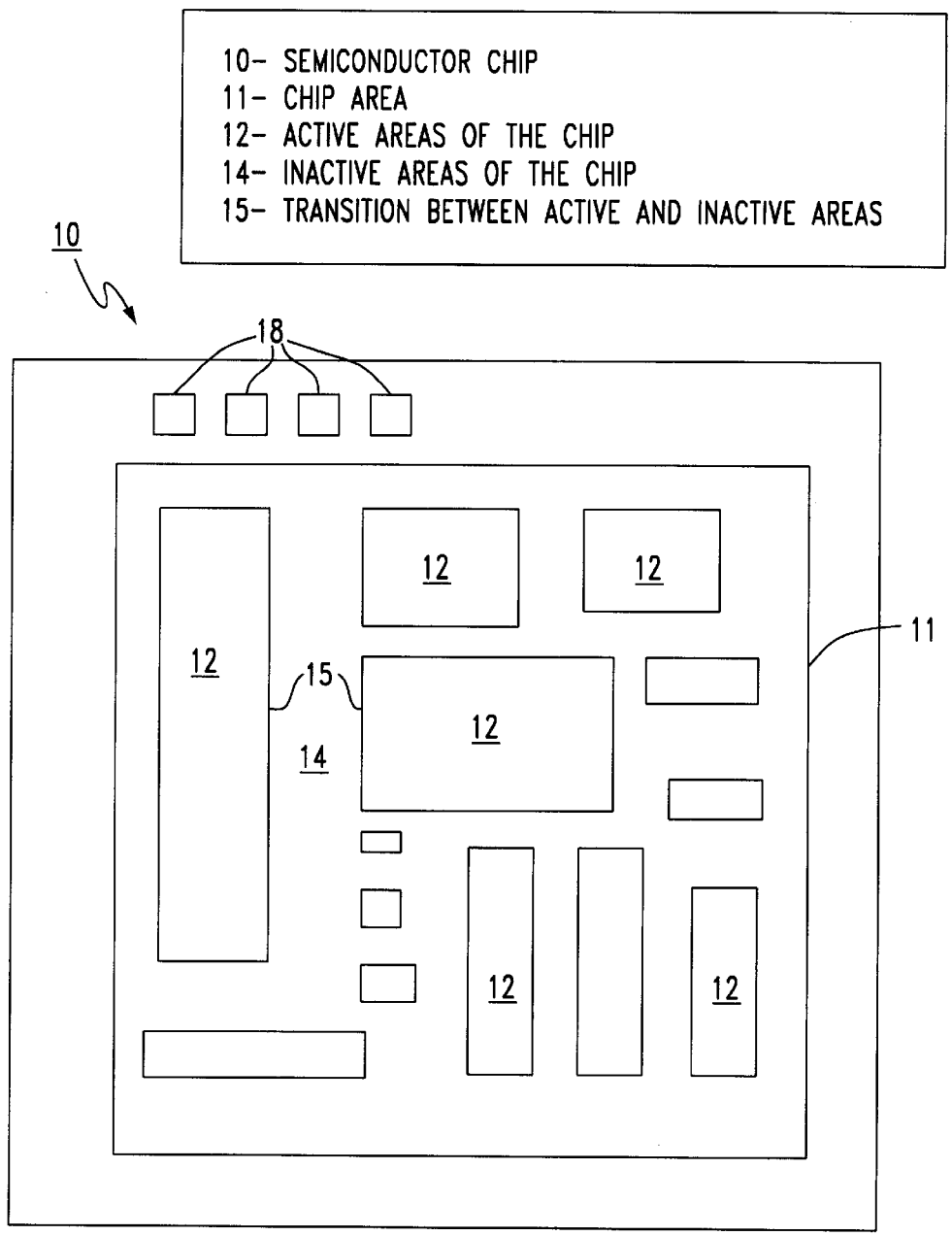
FIG. 1 is a schematic diagram of a semiconductor chip.

FIG. 1 is a schematic diagram illustrating a semiconductor chip 10. Semiconductor chip 10 can contain a discrete semiconductor device, e.g., a bipolar transistor, a field effect transistor, or an integrated circuit, e.g., a radio frequency amplifier, an analog to digital converter, a memory circuit, etc. It should be noted that FIG. 1 only shows a simplified example of actual semiconductor chips having state of art semiconductor devices fabricated thereon. Typically, semiconductor chips contain more features than what is shown in FIG. 1. Semiconductor chip 10 includes a chip area 11, which contains active areas 12 and inactive areas 14. Semiconductor device and/or circuit components are formed only in active areas 12. Therefore, active areas 12 and inactive areas 14 are also referred to as product areas and fill areas, respectively. Defects in active areas 12 can significantly affect the performance, reliability, and yield of semiconductor chip 10. Thus, active areas 12 are also referred to as a critical areas or sensitive areas. On the other hand, inactive areas 14 are also referred to as relaxed areas or insensitive areas. In addition, chip area 11 contains transition areas 15 between active areas 12 and inactive areas 14. In FIG. 1, transition areas are illustrated as dark lines around active areas 12. Typically, the sensitivity of the semiconductor devices to defects in transition areas 15 is between those in active areas 12 and in inactive areas 14. Semiconductor chip 10 also includes mask alignment marks 18 outside chip area 11.

Figure 2:
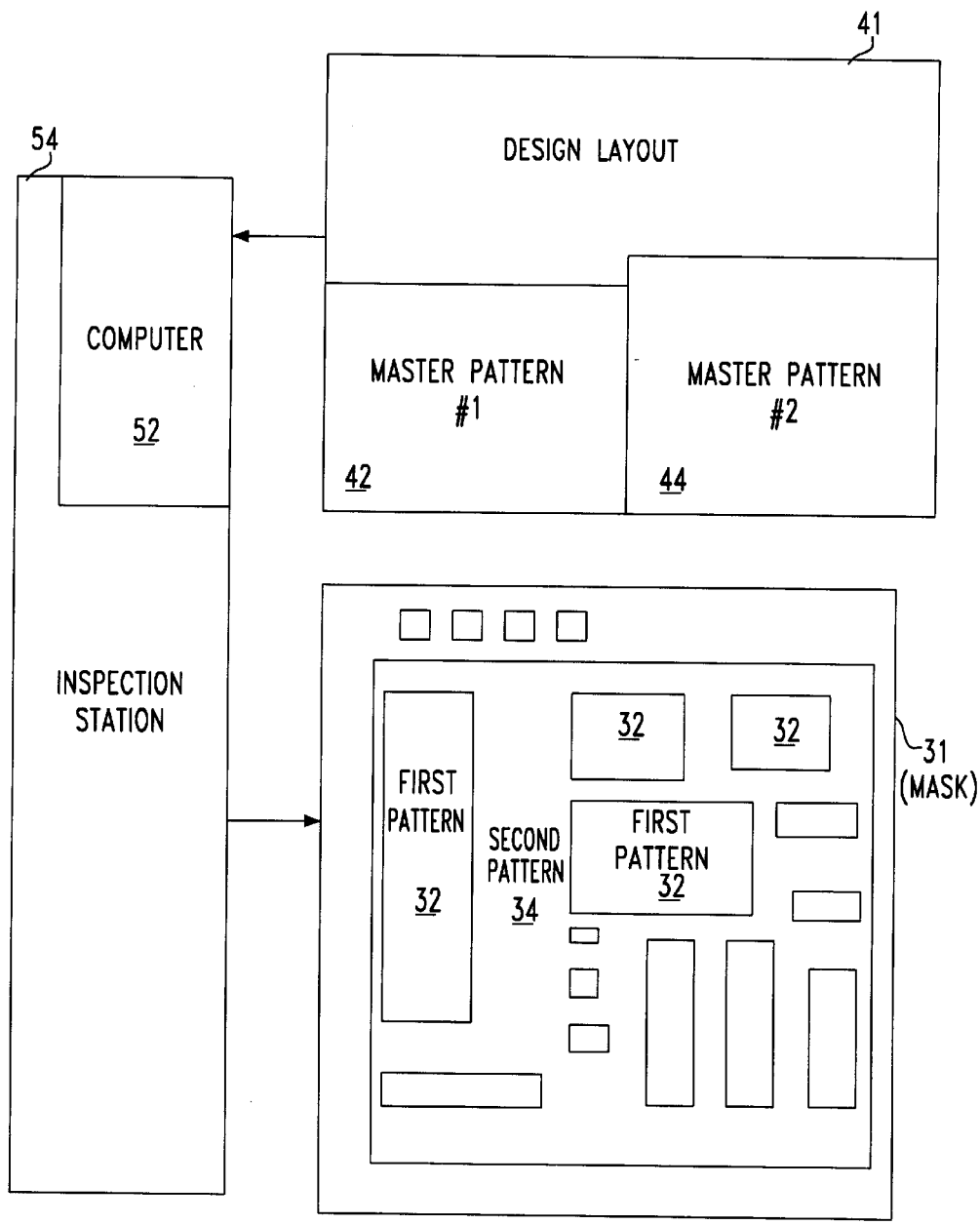
FIG. 2 is a block diagram illustrating a process for inspecting an object in accordance with a first embodiment of the present invention.

FIG. 2 is a block diagram illustrating a process 30 for inspecting an object in accordance with a first embodiment of the present invention. By way of example, process 30 inspects a reticle or a mask 31 used in a photolithography process for fabricating semiconductor chip 10 of FIG. 1.

Mask 31 has a first pattern 32 and a second pattern 34 corresponding to patterns to be formed in active areas 12 and inactive areas 14, respectively, of semiconductor chip 10 (shown in FIG. 1). Patterns 32 and 34 are sometimes also referred to as a first portion and a second portion, respectively, of the pattern formed on mask 31. Mask 31 is patterned using a design layout 41. More particularly, first pattern 32 and second pattern 34 are formed in accordance with a first set 42 of design data and a second set 44 of design data, respectively, contained in design layout 41. Design layout 41 is preferably computer generated and sometimes referred as a layout design or simply a layout. Sets 42 and 44 of design data are also referred to as master patterns. Preferably, sets 42 and 44 of design data are labeled differently from each other and, therefore, are distinguished from each other. In one embodiment, sets 42 and 44 are labeled with different colors in design layout 41. In another embodiment, sets 42 and 44 are labeled with different numerical values. In yet another embodiment, sets 42 and 44 are labeled with different names.

Design layout 41 is preferably stored in a computer 52, which is a part of an inspection station 54. Computer 52 establishes a first mismatch criterion or margin for set 42 of design data and a second mismatch criterion or margin for set 44 of design data. During inspection process 30, inspection station 54 flags mask 31 for repair or scrap if a mismatch between pattern 32 and set 42 of design data is greater than the first mismatch margin or a mismatch between pattern 34 and set 44 of design date exceeds the second mismatch margin. The first criterion is stricter than the second criterion. In other words, the first mismatch margin is smaller than the second mismatch margin. By way of example, the first mismatch margin is approximately 0.3 micrometer ($\mu$m), and the second mismatch margin is approximately 1 $\mu$m.

During inspection process 30, inspection station 54 inspects mask 31 and compares the patterns on mask 31 with design layout 41 stored in computer 52. More particularly, inspection station 54 compares pattern 32 on mask 31 with set 42 of design data and compares pattern 34 on mask 31 with set 44 of design data. If a discrepancy between pattern 32 and set 42 of design data is less than the strict first mismatch criterion and a discrepancy between pattern 34 and set 44 of design data is less than the relaxed second mismatch criterion, mask 31 is considered as being in a satisfactory condition. Inspection station 54 generates an accepting signal to indicate mask 31 as being acceptable. If the discrepancy between pattern 32 and set 42 of design data exceeds the strict first mismatch criterion, inspection station 54 generates a first rejecting signal indicating that mask 31 has a defect in pattern 32. If the discrepancy between pattern 34 and set 44 of design data exceeds the relaxed second mismatch criterion, inspection station 54 generates a second rejecting signal indicating that mask 31 has a defect in pattern 34. By setting the second mismatch criterion to be more relaxed than the first mismatch criterion, inspection process 30 ensures the high quality of mask 31 in pattern 32 and avoids unnecessary repair and/or scrap of mask 31 due to insignificant defects in pattern 34.

Optionally, computer 52 can establish additional mismatch criteria or margins. In one example, computer 52 establishes a third mismatch criterion or margin associated with pattern set 42 of design data and a fourth mismatch criterion or margin associated with set 44 of design data. The third margin is greater than the first margin and the fourth margin is greater than the second margin. If a mismatch or discrepancy between pattern 32 and set 42 of design data is greater than the first margin and less than the third margin, inspection station 54 generates a signal indicating that mask 31 has defects in pattern 32 and the defects are reparable. Mask 31 then goes through a repair process to renovate pattern 32 in accordance set 42 of design data. If the mismatch or discrepancy between pattern 32 and set 42 of design data is substantially equal to or greater than the third margin, inspection station 54 generates a signal indicating that mask 31 has defects in pattern 32 and the defects are irreparable. Mask 31 is then discarded or scraped. Likewise, if a mismatch or discrepancy between pattern 34 and set 44 of design data is greater than the second margin and less than the fourth margin, inspection station 54 generates a signal indicating that mask 31 has defects in pattern 34 and the defects are reparable. Mask 31 then goes through a repair process to renovate pattern 34 in accordance set 44 of design data. If the mismatch or discrepancy between pattern 34 and set 44 of design data is substantially equal to or greater than the fourth margin, inspection station 54 generates a signal indicating that mask 31 has defects in pattern 34 and the defects are irreparable. Mask 31 is then discarded or scraped. In another example, set 42 of design data is divided into several subsets distinguished from each other using different labels. Computer 52 establishes a mismatch criterion or margin for each subset in set 42 of design data. Stricter mismatch criteria correspond to patterns in more sensitive or critical regions within active areas 12 on semiconductor chip 10 (shown in FIG. 1).

Figure 3:
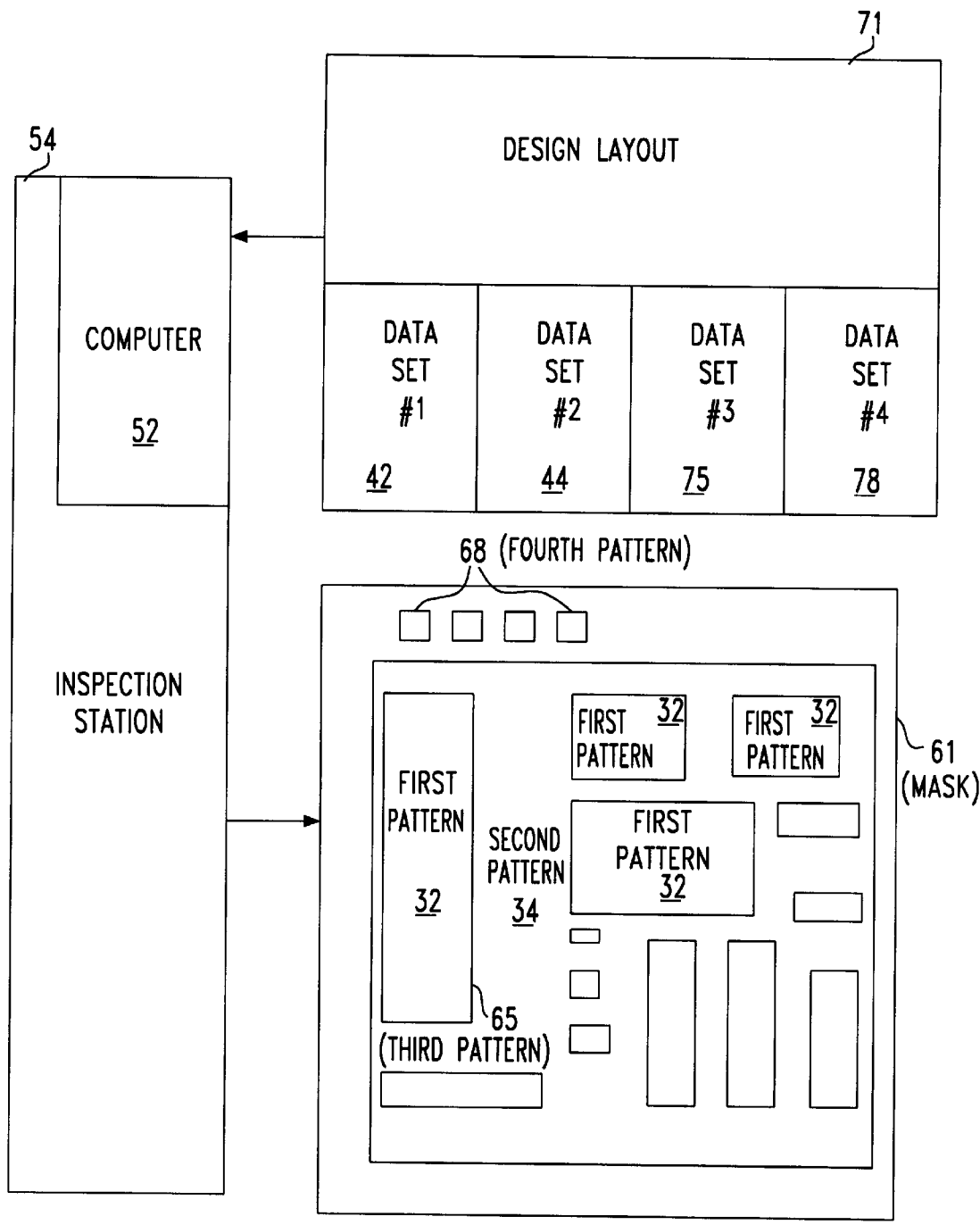
FIG. 3 is a block diagram illustrating a process for inspecting an object in accordance with a second embodiment of the present invention.
Figure 4:
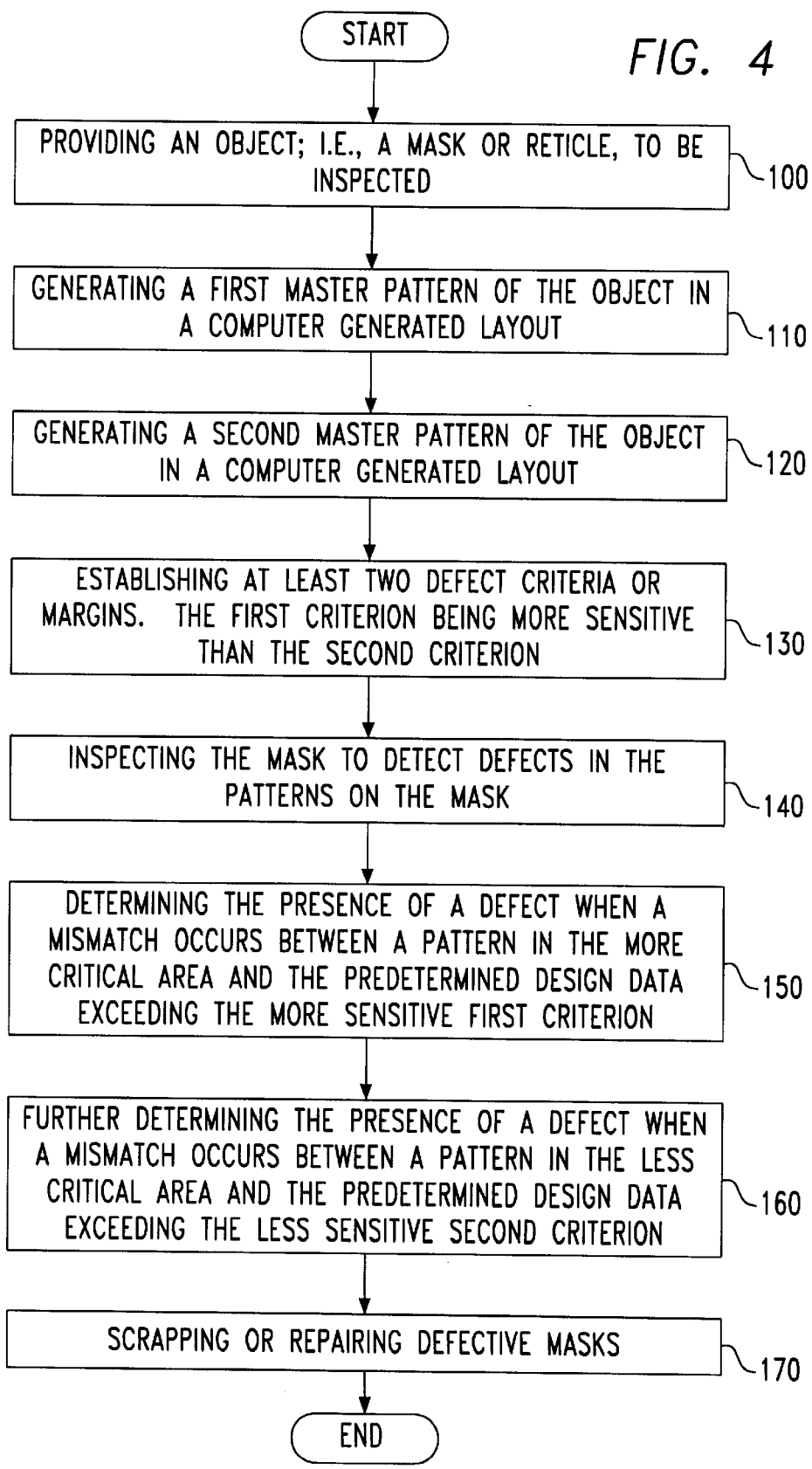
FIG. 4 is a flow chart illustrating the various process steps to perform an inspection of the object.

FIG. 3 is a block diagram illustrating a process 60 for inspecting an object in accordance with a second embodiment of the present invention. By way of example, process 60 inspects a reticle or a mask 61 used in a photolithography process for fabricating semiconductor chip 10 of FIG. 1.

Mask 61 has a first pattern 32 and a second pattern 34 corresponding to patterns to be formed in active areas 12 and inactive areas 14, respectively, of semiconductor chip 10 (shown in FIG. 1). Mask 61 also has a third pattern 65 corresponding to patterns to be formed in transition areas 15 of semiconductor chip 10 (shown in FIG. 1). In addition, mask 61 has a fourth pattern 68 corresponding to mask alignment marks 18 outside chip area 11 on semiconductor chip 10 (shown in FIG. 1). Patterns 32, 34, 65 and 68 are sometimes also referred to as first, second, third, and fourth portions, respectively, of the pattern formed on mask 61. Mask 61 is patterned using a design layout 71. More particularly, patterns 32, 34, 65, and 68 are preferably formed in accordance with sets 42, 44, 75, and 78, respectively, of design data contained in design layout 71. Design layout 71 is preferably computer generated and sometimes referred as a layout design or simply a layout. Sets 42, 44, 75, and 78 of design data are also referred to as master patterns. Preferably, sets 42, 44, 75, and 78 of design data are distinguished from each other through different labels. For example, sets 42, 44, 75, and 78 of design data can be labeled with different colors, different logical data values, or different names.

Design layout 71 is preferably stored in computer 52 in inspection station 54. Computer 52 establishes three mismatch criteria or margins, a first mismatch criterion or margin for set 42 of design data, a second mismatch criterion or margin for sets 44 and 78 of design data, and a third mismatch criterion or margin for set 75 of design data. The second criterion is more relaxed than the first criterion. The third mismatch criterion is more relaxed than the first mismatch criterion but stricter than the second mismatch criterion. In other words, the third mismatch margin is greater than the first mismatch margin and smaller than the second mismatch margin. By way of example, the first mismatch margin is approximately 0.3 µm, the second mismatch margin is approximately 1 µm, and the third mismatch margin is approximately 0.6 µm.

During inspection process 60, inspection station 54 inspects mask 61 and compares the pattern on mask 61 with design layout 71 stored in computer 52. More particularly, inspection station 54 compares patterns 32, 34, 65, and 68 on mask 61 with sets 42, 44, 75, and 78, respectively, of design data. If the mismatches between patterns 32, 34, 65, and 68 and respective sets 42, 44, 75, and 78 of design data are all within the their corresponding mismatch margins, mask 61 is considered as being in a satisfactory condition. Inspection station 54 generates an accepting signal to indicate mask 61 as being acceptable. If any of the above mentioned mismatches exceeds its corresponding mismatch margin, mask 61 is considered defective. Inspection station 54 generates a corresponding signal indicating that mask 61 has a defect in pattern 32, 34, 65, or 68. By setting different mismatch criteria or margins for different patterns on mask 61, inspection process 60 ensures the high quality of mask 61 in critical areas and avoids unnecessary repair and/or scrap of mask 61 due to insignificant defects in non-critical areas.

When mask 61 is defective, it can be either repaired or scraped. Computer 52 can optionally establish additional mismatch criteria or margins to determine if the defect is reparable. If the defect in a pattern, e.g., pattern 65, is reparable, mask 61 is repaired to mend the pattern in accordance with the corresponding set, e.g., set 75, of design data. If the defect in a pattern, e.g., pattern 32, is greater than a predetermined mismatch margin and considered irreparable, mask 61 is discarded or scraped. In a transition region, inspection station 54 can call for an engineer to review the data and use his or her judgment deciding whether a repair can be accomplished.

By now it should be appreciated that a process for inspecting an object has been provided. In accordance with the present invention, the inspection process establishes a plurality of defect criteria. Strict criteria are associated with patterns in more sensitive areas on the object, and relaxed criteria are associated with patterns in less sensitive areas on the object. The inspection process rejects the object as defective only if a mismatch between a pattern in an area and the predetermined design data exceeds a corresponding criterion. By using different criteria for areas of different sensitivities, the inspection process maintains a high standard on the object in the more sensitive areas and relaxes the standard in the less sensitive areas. Consequently, the quality of the pattern on the object is ensured without unnecessarily increasing the repair and scrap costs of the object. The inspection process of the present invention is simple and can be easily implemented through a computer algorithm. The inspection process can be implemented in various types of inspection apparatuses substantially without hardware modifications.

While specific embodiments of the present invention have been shown and described, further modifications and improvements will occur to those skilled in the art. For example, the present invention is not limited to inspecting mask used in semiconductor device fabrication processes. It is also applicable in inspecting other types of objects such as, for example, printed circuit board patterns, machine parts, design patterns, etc.

What is claimed is:

1. A process for inspecting an object, comprising the steps of:
   providing a first and a second master pattern of the object, the first and second master patterns differing from each other;
   determining a first mismatch between the first pattern of the object and the first master pattern exceeding a first criterion, the first criterion representing a first level of sensitivity to defects in the object, wherein the first criterion is a measurement of distance and
   determining a second mismatch between the second pattern of the object and the second master pattern exceeding a second criterion, the second criterion representing a second level of sensitivity to defects in the object, wherein the second criterion is a measurement of distance wherein the first pattern represents areas of the object that are more critical than the areas represented by the second pattern; and
   responsive to the first and second mismatches scrapping or repairing the object.

2. The process as claimed in claim 1, wherein:
   the step of providing a first master pattern and a second master pattern includes generating the first master pattern and the second master pattern in a computer generated layout; and
   the step of providing the object includes providing a mask for semiconductor device fabrication.

3. The process as claimed in claim 1, wherein the step of providing the object includes forming the first pattern in accordance with the first master pattern and forming the second pattern in accordance with the second master pattern.

4. The process as claimed in claim 1, wherein the steps of generating a first signal and generating a second signal include indicating the object as being defective.

5. The process as claimed in claim 1, further comprising the step of indicating the object as being in a satisfactory condition in response to the first mismatch being less than the first criterion and the second mismatch being less than the second criterion.

6. The process as claimed in claim 1, further comprising the steps of:
   renovating the first pattern in accordance with the first master pattern in response to the first mismatch exceeding the first criterion; and
   renovating the second pattern in accordance with the second master pattern in response to the second mismatch exceeding the second criterion.

7. A process for inspecting a mask, comprising the steps of:
   providing a layout design having a first and a second set of design data, the first and second set of design data differing from each other;
   providing the mask with a first and a second pattern thereon, the first and second patterns differing from each other, the first pattern being more critical than the second pattern;
   establishing a first and second criterion, wherein the first and the second criterion are measurements of distance said first criterion being more sensitive to defects than the second criterion;

comparing the mask with the layout design;

accepting the mask in the absence of mismatches, or when a first mismatch between the first pattern and the first set of design data is less than the first criterion and a second mismatch between the second pattern and the second set of design data is less than the second criterion; and scrapping or repairing the mask when a first mismatch between the first pattern and the first set of design data exceeds the first criterion or when a second mismatch between the second pattern and the second set of design data exceeds the second criterion.

8. The process as claimed in claim 7, wherein:

the step of providing a layout design includes providing a layout design for a semiconductor chip; and the step of providing the mask includes forming the first pattern and the second pattern on the mask in accordance with the first set of design data and the second set of design data, respectively.

9. The process as claimed in claim 8, wherein the step of providing a layout design further includes the steps of:

generating the first set of design data for an active area of the semiconductor chip; and generating the second set of design data for an inactive area of the semiconductor chip.

10. The process as claimed in claim 9, wherein the step of establishing a first criterion and a second criterion includes setting the second criterion as being more relaxed than the first criterion.

11. The process as claimed in claim 10, wherein the step of establishing a first criterion and a second criterion includes setting the first criterion as being approximately 0.3 micrometer and setting the second criterion as being approximately 1 micrometer.

12. The process as claimed in claim 7, wherein:

the step of providing a layout design further includes providing the layout design having a third set of design data; and the step of providing the mask further include providing the mask having a third pattern thereon.

13. The process as claimed in claim 12, further comprising the steps of:

establishing a third criterion; and rejecting the mask in response to a third mismatch between the third pattern and the third set of design data exceeding the third criterion.

14. The process as claimed in claim 13, wherein the step of establishing a third criterion includes establishing the third criterion as being more relaxed than the first criterion and stricter than the second criterion.

15. A process for inspecting a pattern on an object, comprising the steps of:

a) providing a design having a first and a second set of design data, the first and second set of design data differing from each other;

b) establishing a first and second margin of the object the first and second margin wherein the first and the second margin are measurement of distance representing a first and a second sensitivity to defects;

c) comparing the pattern on the object with the design;

d) determining a first mismatch between a first portion of the pattern on the object and the first set of design data exceeding the first margin;

e) determining a second mismatch between a second portion of the pattern on the object and the second set of design data exceeding the second margin; and f) scrapping or repairing the object in response to step d) or e).

16. The process as claimed in claim 15, further comprising the step of forming the first portion of the pattern and the second portion of the pattern on the object in accordance with the first set of design data and the second set of design data, respectively.

17. The process as claimed in claim 15, further comprising the step of establishing a third margin greater than the first margin.

18. The process as claimed in claim 17, further comprising the steps of:

mending the first portion of the pattern on the object in accordance with the first set of design data in response to the first signal and the first mismatch being less than the third margin; and discarding the object in response to the first mismatch being substantially equal to or greater than the third margin.

19. The process as claimed in claim 17, further comprising the step of establishing a fourth margin greater than the second margin.

20. The process as claimed in claim 19, further comprising the steps of:

mending the second portion of the pattern on the object in accordance with the second set of design data in response to the second signal and the second mismatch being less than the fourth margin; and discarding the object in response to the second mismatch being substantially equal to or greater than the fourth margin.

* * * * *